(12) United States Patent
Narathong et al.

(10) Patent No.: US 7,863,986 B2
(45) Date of Patent: Jan. 4, 2011

(54) TECHNIQUES FOR IMPROVING BALUN LOADED-Q

(75) Inventors: Chiewcharn Narathong, Laguna Niguel, CA (US); Sankaran Aniruddhan, San Diego, CA (US)

(73) Assignee: QUALCOMM Incorporation, San Diego, CA (US)

( * ) Notice: Subject to any disclaimer, the term of this patent is extended or adjusted under 35 U.S.C. 154(b) by 36 days.

(21) Appl. No.: 12/189,756

(22) Filed: Aug. 11, 2008

(65) Prior Publication Data

US 2010/0033253 A1 Feb. 11, 2010

(51) Int. Cl.
*H03F 3/04* (2006.01)
(52) U.S. Cl. .................. 330/301; 330/165; 330/276
(58) Field of Classification Search ............... 330/301, 330/165, 276
See application file for complete search history.

(56) References Cited

U.S. PATENT DOCUMENTS

| | | | | |
|---|---|---|---|---|
| 3,693,176 | A * | 9/1972 | Kenner | 365/243 |
| 3,818,430 | A * | 6/1974 | Williams | 340/941 |
| 4,975,659 | A * | 12/1990 | Butler et al. | 330/307 |
| 5,867,061 | A * | 2/1999 | Rabjohn et al. | 330/124 R |
| 6,046,641 | A * | 4/2000 | Chawla et al. | 330/277 |
| 6,487,398 | B1 | 11/2002 | Nobbe et al. | |
| 2002/0149425 | A1 | 10/2002 | Chawla et al. | |

OTHER PUBLICATIONS

Abidi A.A. et al: "A Merged CMOS LNA and Mixer for WCDMA Receiver," IEEE Journal of Solid-State Circuits, IEEE Service Center, vol. 38, No. 6, Jun. 1, 2003, pp. 1045-1050.
International Search Report and Written Opinion - PCT/US2009/053460 - International Search Authority - European Patent Office, Mar. 11, 2009 (080365).
Jun-De Jin et al: "A 70-GHz Transformer-Peaking Broadband Amplifier in 0.13-1 1/4 m CMOS Technology," Microwave Symposium Digest, 2008 IEEE MTT-S International, IEEE, Piscataway, NJ, USA, Jun. 15, 2008, pp. 285-288.
Youn Y-S et al: "A 2-GHZ RF Front-End Transceiver Chipset in CMOS Technology for PCS and IMT-2000 Applications," 2002 IEEE MTT-S International Microwave Symposium Digest, Jun. 2, 2002, pp. 17-20.
Yu-Hsuan Liu et al: "A CMOS Transmitter Front-End with Digital Power Control for WiMAX 802.16e applications," Microwave Conference Proceedings, 2005, Piscataway, NJ, USA, IEEE, vol. 3, Dec. 4, 2005.

\* cited by examiner

*Primary Examiner*—Patricia Nguyen
(74) *Attorney, Agent, or Firm*—Jiayu Xu

(57) ABSTRACT

Techniques for improving the quality factor ("Q") of a balun in the presence of loading stages are disclosed. In an exemplary embodiment, the ground node of a balun secondary (single-ended) element is connected to a source node of an amplifier stage via a common ground node. The connection may be made physically short to minimize any parasitic elements. In another exemplary embodiment, the common ground node may be coupled to an off-chip ground voltage via a peaking inductor. The peaking inductor may be implemented on-chip, e.g., as a spiral inductor, or off-chip e.g., using bondwires.

25 Claims, 9 Drawing Sheets

TECHNIQUES FOR IMPROVING BALUN LOADED-Q

TECHNICAL FIELD

The disclosure relates to baluns, and more specifically, to techniques for improving the quality factor of baluns coupled to subsequent loading stages in a circuit.

BACKGROUND

Modern electrical devices such as communications transmitters often incorporate a balun for converting a differential signal into a single-ended signal. For example, a wireless transmitter circuit may employ a balun for converting a differential signal generated by the transmitter circuitry into a single-ended signal for further amplification and transmission over a wireless channel. A common balun implementation includes two mutually coupled inductive elements, configured such that a differential voltage across the first (primary) balun element generates a corresponding single-ended voltage across the second (secondary) balun element.

In the design of baluns for communications devices, the quality factor (or "Q") of a balun is a key figure of merit. A higher Q generally leads to higher balun output voltage, along with better power transfer and signal-to-noise ratio (SNR) characteristics for the overall device. When the secondary balun element is coupled to subsequent loading stages, the Q of the loaded balun (or "loaded-Q") may be reduced due to the presence of resistive load elements, causing poorer overall device performance.

It would be desirable to provide simple and efficient techniques for improving balun loaded-Q.

SUMMARY

An aspect of the present disclosure provides a method for improving a resonance factor of a balun coupled to an amplifier, the balun comprising a balun secondary element for providing a single-ended signal to the amplifier, the balun secondary element comprising a first node and a second node, the amplifier comprising a source node, the method comprising: coupling the balun secondary element second node to the amplifier source node via a common ground node; and coupling the common ground node to a ground voltage.

Another aspect of the present disclosure provides a transmitter apparatus comprising a balun coupled to an amplifier, the balun comprising a balun secondary element for providing a single-ended signal to the amplifier, the balun secondary element comprising a first node and a second node, the amplifier comprising a source node, wherein the balun secondary element second node is coupled to the amplifier source node via a common ground node; and the common ground node is coupled to a ground voltage.

Yet another aspect of the present disclosure provides an apparatus comprising a balun coupled to an amplifier, the balun comprising a balun secondary element for providing a single-ended signal to the amplifier, the balun secondary element comprising a first node and a second node, the amplifier comprising an input node and a source node, the balun secondary element first node coupled to the input node of the amplifier, the apparatus further comprising: means for coupling the amplifier source node to the balun secondary element second node at a common ground node using a trace of minimum length.

BRIEF DESCRIPTION OF DRAWINGS

FIG. 3 depicts an exemplary embodiment according to the present disclosure wherein the node 101.2b of the balun secondary element 101.2 is coupled on-chip to the node 200a of amplifier 200 via a common ground node 300a.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
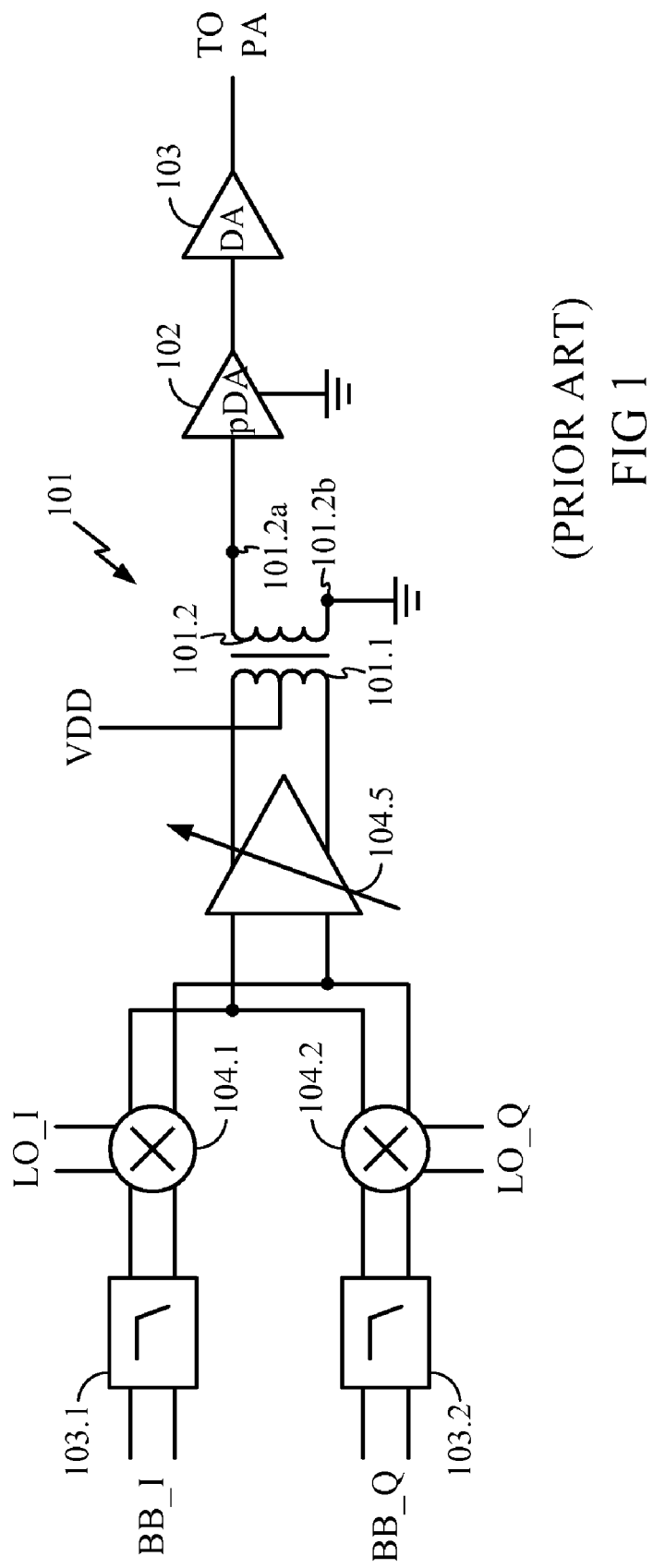
FIG. 1 depicts an exemplary embodiment of a prior art transmitter circuit for a communications device.

FIG. 1 depicts an exemplary embodiment of a prior art transmitter circuit for a communications device. In FIG. 1, baseband input signals BB_I (in-phase) and BB_Q (quadrature-phase) are provided to low-pass filters 103.1 and 103.2 The output signals of the low-pass filters are provided to mixers 104.1 and 104.2, which modulate the filtered baseband signals to a higher frequency by multiplying them with local oscillator signals LO_I and LO_Q, respectively. The differential outputs of the mixers 104.1 and 104.2 are combined and provided to a variable-gain amplifier (VGA) 104.5, whose gain is dynamically controlled. The differential output of the VGA 104.5 is then coupled to a balun primary element 101.1 of balun 101. Balun 101 also includes a balun secondary element 101.2 electromagnetically coupled to the balun primary element 101.1. The balun 101 functions to convert a differential voltage across the balun primary element 101.1 to a single-ended voltage at node 101.2a of the balun secondary element 101.2, wherein the other node 101.2b of the balun secondary element 101.2 is coupled to a ground voltage. In FIG. 1, the balun primary and secondary elements are shown as mutually coupled inductors, although the present disclosure is not limited to implementations of baluns as mutually coupled inductors. In FIG. 1, the balun primary inductance 101.1 is tapped to a DC supply voltage VDD, and the AC voltage at either node of the balun primary inductance 101.1 may generally exceed VDD.

In FIG. 1, the node 101.2a of the balun secondary element 101.2 is coupled to a pre-driver amplifier (pDA) 102, followed by a driver amplifier (DA) 103. The output of the DA 103 may be used to drive a power amplifier (PA) and/or other off-chip circuitry.

Note the transmitter architecture depicted in FIG. 1 is shown for illustration only. One of ordinary skill in the art will realize that alternative transmitter architectures may omit some of the elements shown, or incorporate other elements not shown. For example, the transmitter need not incorporate both a pDA and a DA; an alternative implementation may incorporate only a DA directly coupled to the balun secondary element. The techniques of the present disclosure are contemplated to apply to such alternative transmitter architectures.

Note also that the transmitter circuit depicted in FIG. 1 is not intended to limit the scope of the present disclosure to transmitter circuits. The techniques of the present disclosure may generally be applied in any design wherein a balun is coupled to a subsequent loading stage, e.g., in a low-noise amplifier (LNA) for a receiver circuit. Such exemplary embodiments are contemplated to be within the scope of the present disclosure.

Figure 2:
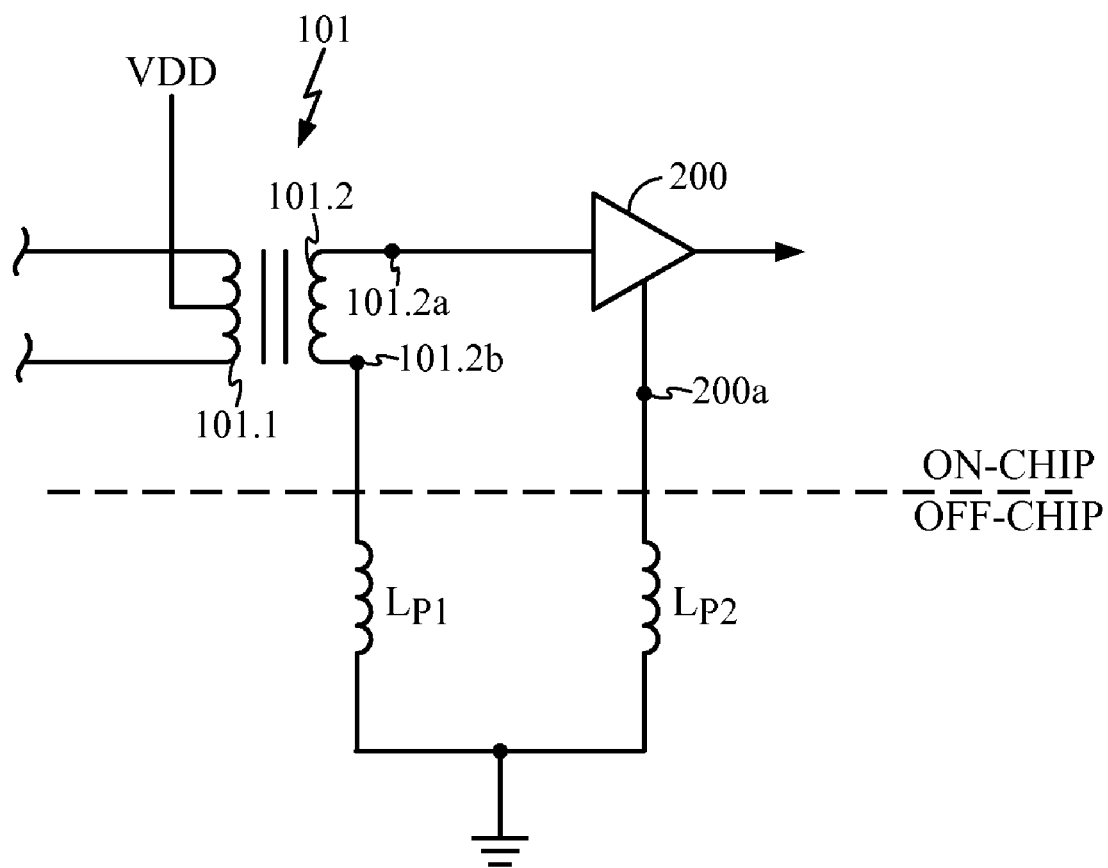
FIG. 2 depicts parasitic elements present in practical implementations of a balun 101 coupled to an amplifier 200 such as the pDA 102 shown in FIG. 1.

FIG. 2 depicts parasitic elements present in practical implementations of a balun 101 coupled to an amplifier 200 such as the pDA 102 shown in FIG. 1. In FIG. 2, the balun 101 and amplifier 200 are shown as being both implemented on a single chip ("on-chip"), and separately coupled to ground voltage connections external to the chip ("off-chip"). Parasitic elements are generally present in the conductive traces coupling on-chip nodes to the off-chip nodes, e.g., parasitic inductances arising from bondwires. In FIG. 2, parasitic inductance $L_{P1}$ is present in series between node 101.2b of the balun secondary element 101.2 and the off-chip ground voltage, while parasitic inductance $L_{P2}$ is present in series between node 200a of the amplifier 200 and the off-chip ground voltage.

One of ordinary skill in the art will realize that additional parasitic elements not shown in FIG. 2, e.g., parasitic resistances and capacitances, may also be present in practical implementations of a balun coupled to an amplifier.

Figure 2A:
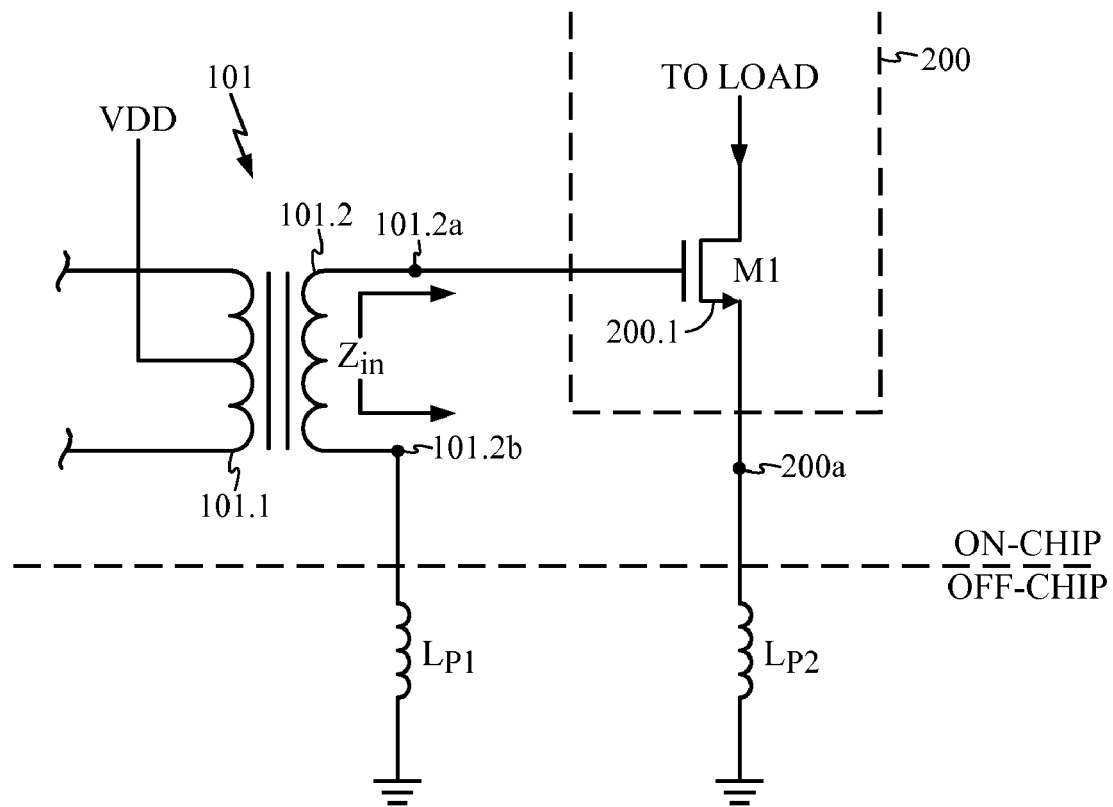
FIG. 2A depicts a specific circuit implementation of an amplifier 200 illustrating the effects of the parasitic inductances shown in FIG. 2 on transmitter circuit performance.

FIG. 2A depicts a specific circuit implementation of the amplifier 200 illustrating the effects of the parasitic inductances on transmitter circuit performance. Note that for simplicity, FIGS. 2A, 3 and 3A herein omit the particulars of the biasing scheme used to bias the transistors shown, and one of ordinary skill in the art may readily derive the requisite biasing/AC coupling networks for the amplifier shown. Note also that the specific circuit implementation of the amplifier 200 is shown for illustration only, and one of ordinary skill in the art will appreciate that the techniques of the present disclosure may nevertheless be applied to amplifier topologies different from that shown in FIG. 2A. Such exemplary embodiments are contemplated to be within the scope of the present disclosure.

In FIG. 2A, amplifier 200 includes an NMOS transistor M1 or 200.1 connected in a common-source amplifier configuration, wherein the gate of M1 is coupled to node 101.2a of balun secondary element 101.2, the drain is coupled to a load (not shown), and the source at node 200a is coupled to an off-chip ground voltage via parasitic inductance $L_{p2}$. One of ordinary skill in the art will realize that, as measured from the two nodes 101.2a and 101.2b of the balun secondary element 101.2, the input impedance $Z_{in}$ to the common-source amplifier in FIG. 2A is given by (Equation 1):

$$Z_{in} = s(L_{p1} + L_{p2}) + \frac{1}{sC_{gs}} + \left(\frac{g_{m1}}{C_{gs}}\right)(L_{p1} + L_{p2});$$

wherein $C_{gs}$ is the gate-to-source capacitance of M1 (not shown), and $g_{m1}$ is the transconductance of M1. (See, e.g., Derek K. Shaeffer and Thomas H. Lee, "A 1.5V, 1.5 GHz CMOS Low Noise Amplifier," IEEE J. Solid-State Circuits (1997) 745-759).

From Equation 1, it may be seen that the parasitic inductances $L_{p1}$ and $L_{p2}$ contribute a real (resistive) component $$\left(\frac{g_{m1}}{C_{gs}}\right)(L_{p1} + L_{p2})$$

to the input impedance $Z_{in}$. This resistive component is effectively coupled in series with the balun secondary element 101.2 at the interface between the balun secondary element 101.2 and amplifier 200. The resistive component contributed by $L_{p1}$ and $L_{p2}$ decreases the Q of the balun-amplifier input combination, as the quality factor or Q for the combination is given by the following expression (Equation 2):

$$Q = \frac{1}{R}\sqrt{\frac{L}{C}}.$$

As Q decreases, the balun output amplitude at node 101.2a also decreases. As previously described, this may lead to lower output power and lower signal-to-noise ratio (SNR) in the overall transmit signal chain.

An object of conventional circuit design is to reduce the parasitic inductances $L_{p1}$ and $L_{p2}$ in order to increase the Q of the balun-to-amplifier interface. To reduce the parasitic inductances, such conventional design techniques seek to minimize the ground path inductances of the balun and the amplifier. For example, in QFN (Quad Flat No Leads)-type packages, multiple bondwires in parallel may be provided to couple the balun and/or amplifier to the off-chip ground voltage, to minimize the parasitic inductances $L_{p1}$ and $L_{p2}$. In flip-chip type packages, the distances between the chip, flip-chip package, and the printed circuit board (PCB) ground layer may be minimized, and multiple bumps may be provided for the ground connections of the balun and the amplifier. The effectiveness of such techniques is limited, however, as the package and routing inductances necessarily possess finite length, thus setting an upper bound on how much the parasitic inductances may be decreased. Moreover, increasing the number of bondwires or bumps allocated for ground consumes available connections that may be provided for other nodes.

Alternatively, to increase the balun output voltage, the balun secondary element may be designed to have a greater number of turns to increase the coupling ratio between the balun primary and secondary elements. However, this increases the inductance of the balun secondary element, and undesirably lowers the resonance frequency associated with the balun-amplifier input node.

Figure 3:
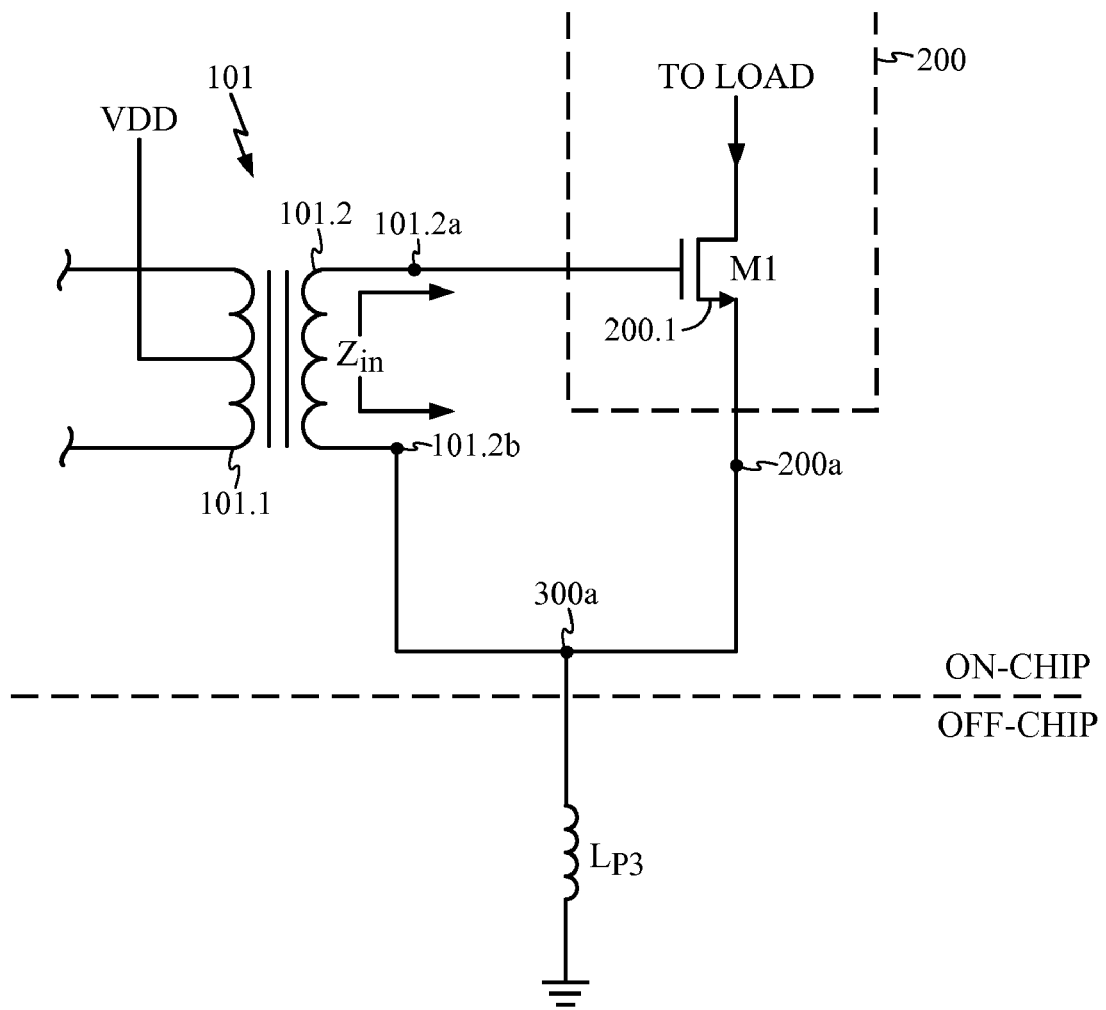

FIG. 3 depicts an exemplary embodiment according to the present disclosure for reducing the negative effects of the parasitic ground inductances described above. In FIG. 3, the node 101.2b of the balun secondary element 101.2 is coupled on-chip to the node 200a of amplifier 200 via a common ground node 300a. The common ground node 300a is coupled to an off-chip ground connection via parasitic inductance $L_{p3}$.

In an exemplary embodiment, the connection from node 101.2b to node 200a is minimized in length to reduce the effect of parasitic elements appearing in series between these two nodes. In an exemplary embodiment, the connection from node 101.2b to node 300a has a symmetric layout relative to the connection from node 200a to node 300a to provide a well-balanced ground connection. For example, node 300a may be tapped as the mid-point of the minimum-length trace from node 101.2b to node 200a.

Because the nodes 101.2b and 200a are directly connected on-chip using traces of preferably short length, the series parasitic inductance between the source of M1 and node 101.2b of the balun secondary element 101.2 is minimized. This leads to a smaller series resistive component in the input impedance Zin, which in turn leads to a higher Q for the series RLC circuit as compared to the implementation shown in FIG. 2A.

Figure 3A:
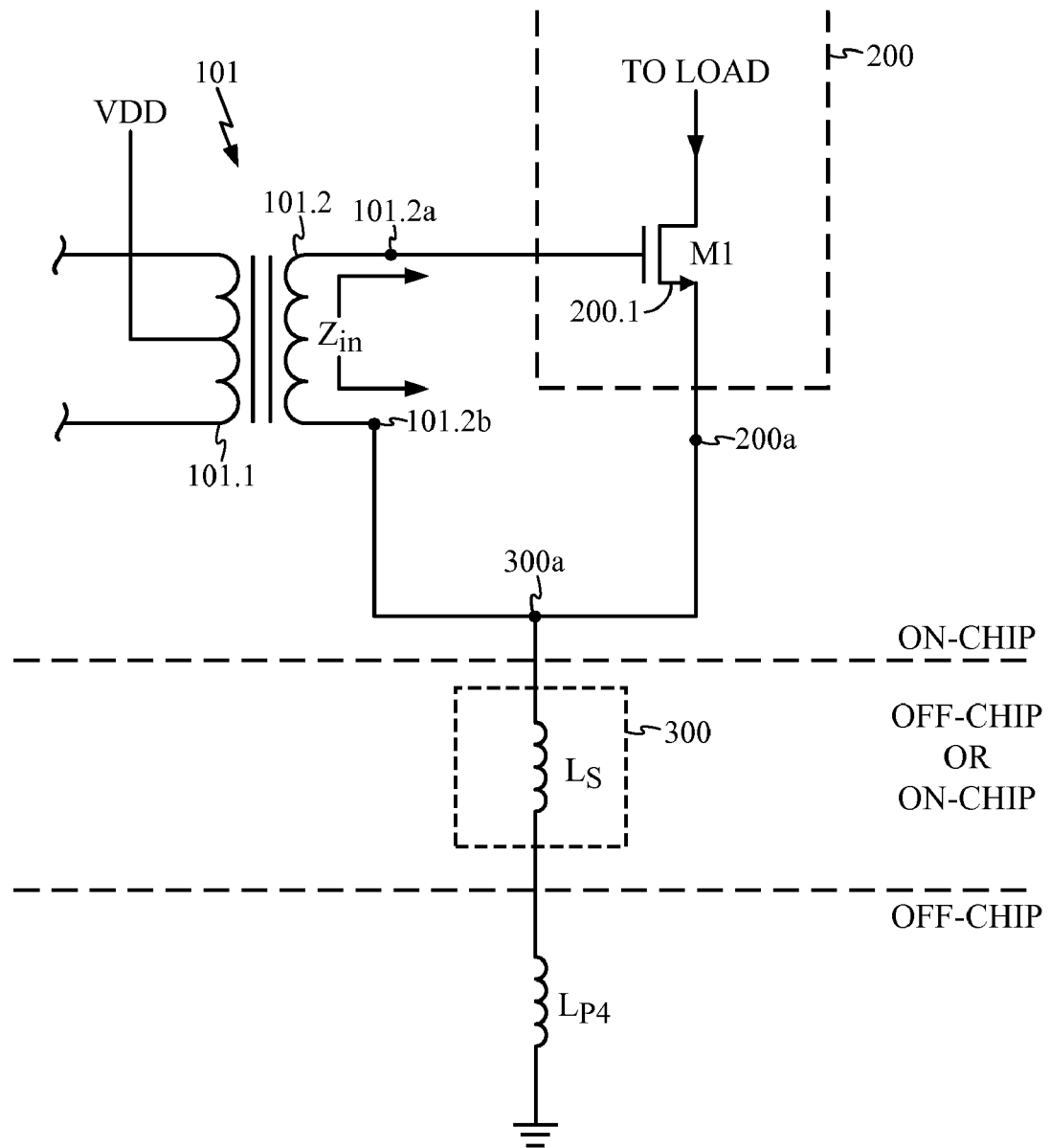
FIG. 3A depicts a further exemplary embodiment according to the present disclosure wherein node 300a is further coupled to an off-chip ground voltage through a peaking inductor 300, which may be provided on-chip or off-chip.

FIG. 3A depicts a further exemplary embodiment according to the present disclosure wherein node 300a is coupled to the off-chip ground voltage via a peaking inductor 300 having inductance $L_s$, which may be provided on-chip or off-chip. If provided on-chip, the peaking inductor 300 may be further coupled to an off-chip ground voltage via conventional bondwires or bumps, which may contribute a parasitic inductance $L_{p4}$ in series with the peaking inductor 300, as shown in FIG. 3A. The peaking inductor 300 alters the transfer characteristics of the amplifier versus the balun, and may help boost the balun output voltage amplitude, as well as increase the resonant frequency at the balun output/amplifier input.

Figure 3B:
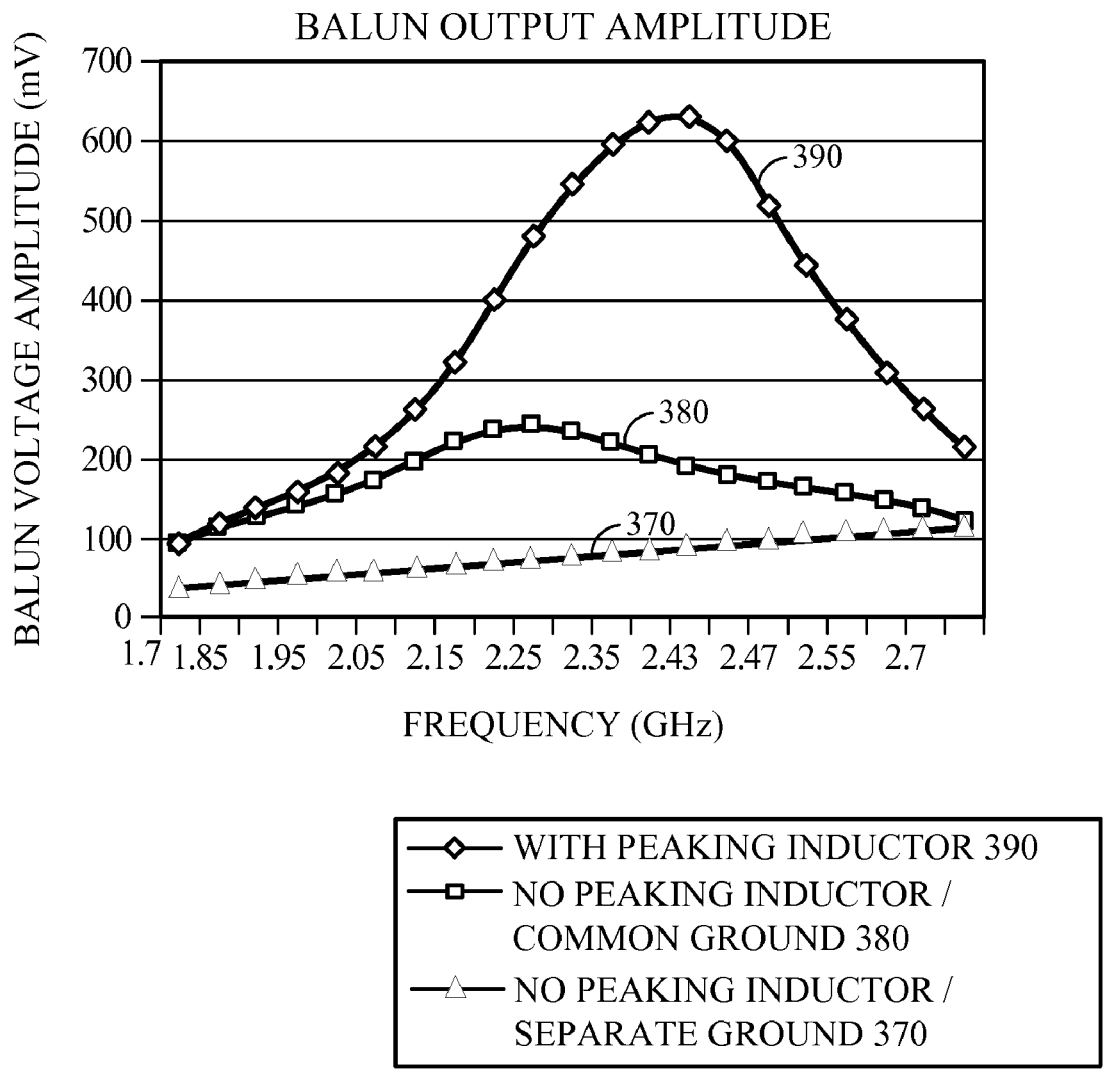
FIG. 3B illustrates an example of the change in the frequency characteristics of the balun secondary element voltage amplitude in accordance with the techniques disclosed herein.

FIG. 3B shows an example plot comparing the balun output voltage amplitude versus frequency in accordance with the techniques disclosed hereinabove. In FIG. 3B, a first characteristic 370 depicts the balun output voltage amplitude when no peaking inductor is used, and the ground connections of the balun and pDA are separately provided for. A second characteristic 380 depicts the balun output voltage amplitude when no peaking inductor is used, and the ground connections of the balun and pDA are tied together, e.g., as depicted in FIG. 3. A third characteristic 390 depicts the balun output voltage amplitude when a peaking inductor is used, and the ground connections of the balun and pDA are tied together, e.g., as depicted in FIG. 3A. To derive the characteristic 390 shown in FIG. 3B, 1.5 nH is used for the peaking inductor 300.

As noted from FIG. 3B, both the balun output voltage and the balun resonance frequency are increased by the addition of the peaking inductor 300.

In an exemplary embodiment, to determine an optimum inductance value for the peaking inductor 300, one of ordinary skill in the art may sweep the inductance over a candidate range of values when designing the circuit to determine an inductance associated with maximal peaking in the desired frequency range of operation. For example, for operation in a 2.4 GHz frequency band, the inductance value may be swept over a range from 0.5 to 3 nH to determine an optimum value. In an exemplary embodiment, the sweeping may be done using computer circuit simulation, in-lab measurements, etc.

One of ordinary skill in the art will realize that peaking inductor 300 may be implemented in a variety of ways. For example, peaking inductor 300 may comprise an on-chip spiral. In an exemplary embodiment, the spiral may be a rectangular spiral with dimensions 120 µm×65 µm. In an alternative exemplary embodiment, peaking inductor 300 may be implemented as an off-chip bondwire. In an alternative exemplary embodiment, peaking inductor 300 may be implemented as a metal trace on a printed circuit board. For example, a metal trace of about 1 mm may be used to provide an inductance of approximately 1 nH.

In an exemplary embodiment, a parasitic series resistance associated with the peaking inductor 300 is designed to be as small as possible. This is to minimize the gain loss associated with source degeneration of the amplifier 200, as well as to minimize DC current dissipation by the peaking inductor 300.

Figure 6:
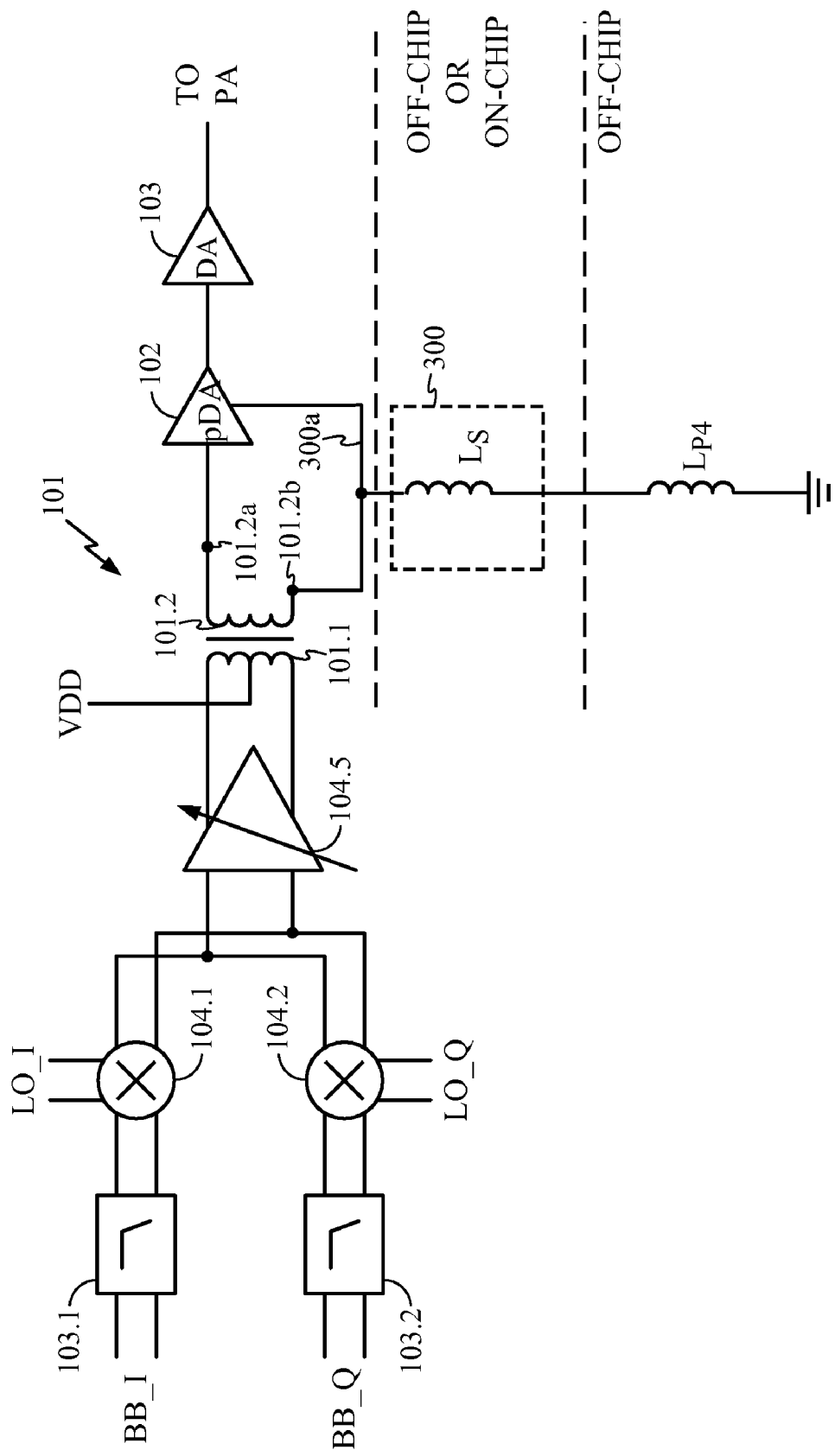
FIG. 6 depicts an additional buffer (driver) amplifier interposed between the amplifier according to the present disclosure and a subsequent output loading stage.

One of ordinary skill in the art will also appreciate that there may exist a positive feedback loop consisting of the amplifier NMOS transistor and the balun secondary element through the input and ground paths. To preserve the stability of the amplifier, it may be desirable to reduce the capacitive loading on the output of the amplifier. In an exemplary embodiment, such as shown in FIG. 6, an additional buffer amplifier or amplifiers may be interposed between the amplifier and a subsequent output loading stage. For example, in FIG. 6, a DA 103 is coupled to the output of pDA 102, wherein pDA 102 is directly coupled to the peaking inductor 300, and DA 103 effectively functions as a buffer amplifier. In this way, the pDA 102 may avoid directly driving a heavy capacitive load such as an off-chip PA, thereby increasing the stability margin when the peaking inductor 300 is utilized.

One of ordinary skill in the art will realize that, in alternative exemplary embodiments (not shown), a plurality of DA's 103 may be coupled in parallel at the output of the pDA 102. In a further exemplary embodiment, the pDA 102 may be coupled directly to a PA, i.e., bypassing a DA, if the stability margin and other considerations do not require that a DA buffer be provided. Such exemplary embodiments are contemplated to be within the scope of the present disclosure.

Figure 4:
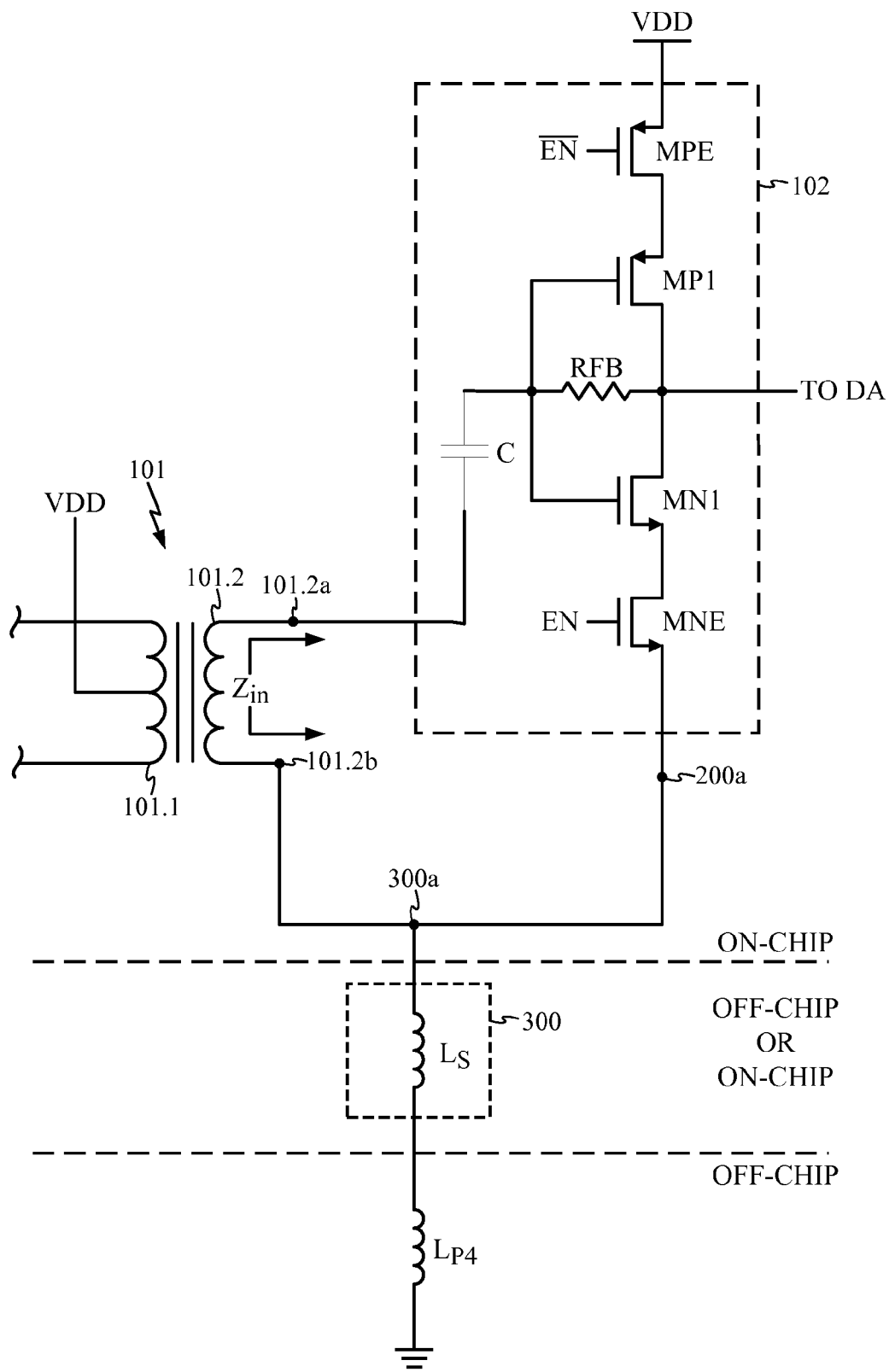
FIG. 4 depicts an exemplary embodiment of a balun coupled to a pDA according to the present disclosure.

FIG. 4 depicts an exemplary embodiment of a balun coupled to a pDA in a transmitter circuit according to the present disclosure. In FIG. 4, pDA 102 includes active NMOS transistor MN1 and active PMOS transistor MP1, each connected in a common-source amplifier configuration, with the amplifier output coupled to the amplifier input via resistor RFB for self-biasing. AC coupling capacitor C is provided to preserve the DC biasing of the amplifier. Additional transistors MNE and MPE are coupled to the active transistors MN1 and MP1 to selectively enable or disable the amplifier based on a control signal EN.

Figure 5:
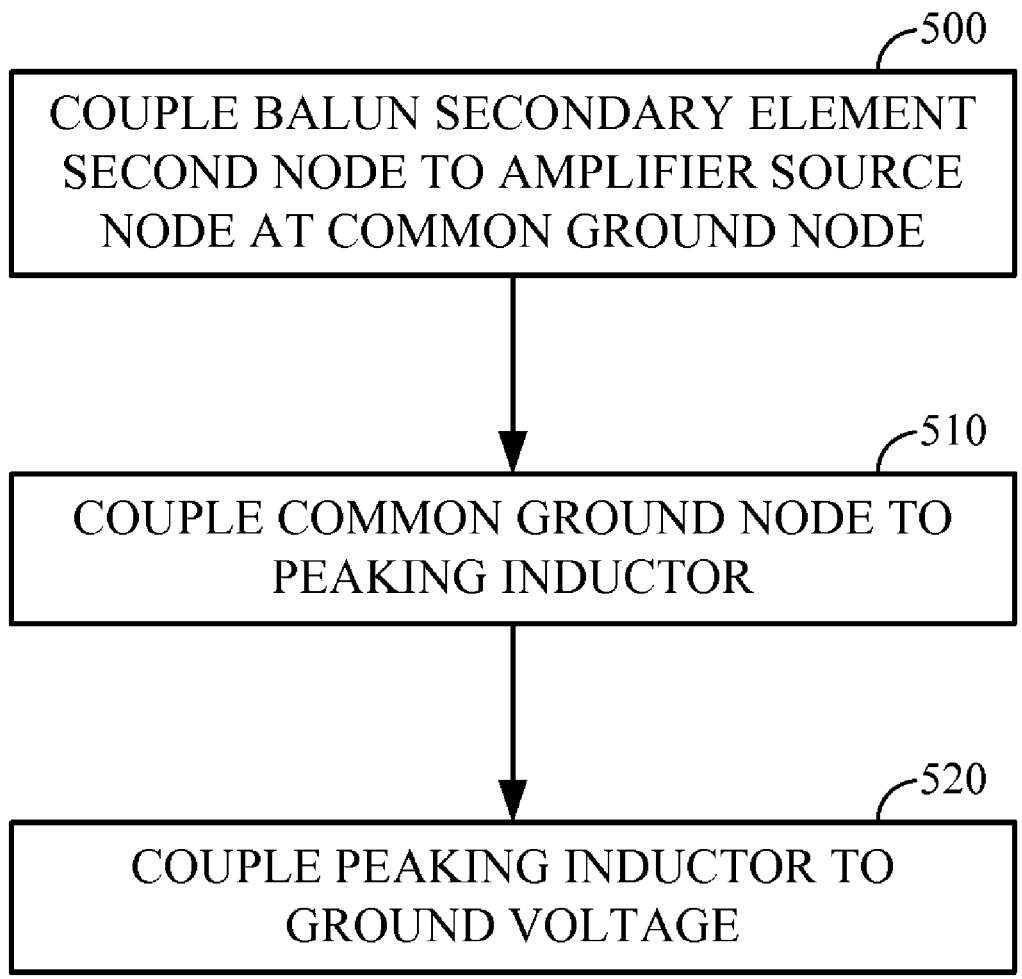
FIG. 5 depicts an exemplary embodiment of a method according to the present disclosure.

FIG. 5 depicts an exemplary embodiment of a method according to the present disclosure. FIG. 5 assumes the presence of a balun coupled to an amplifier, the balun having a balun secondary element with a first node and a second node, with an amplifier input node coupled to the first node. In FIG. 5, at step 500, a balun secondary element second node is coupled to an amplifier source node at a common ground node. At step 510, the common ground node is coupled to a peaking inductor. At step 520, the peaking inductor is coupled a ground voltage.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for improving a resonance factor of a balun coupled to an inverter amplifier having an input node and a source node and comprising an NMOS transistor and a PMOS transistor configured as common-source amplifiers, the balun comprising a balun secondary element for providing a single-ended signal to the inverter amplifier, the balun secondary element comprising a first node and a second node, the balun secondary element first node coupled to the input node of the inverter amplifier, the method comprising:
   coupling the balun secondary element second node to the inverter amplifier source node via a common ground node; and
   coupling the common ground node to a ground voltage.

2. The method of claim 1, the inverter amplifier being a pre-driver amplifier, the pre-driver amplifier further coupled to a driver amplifier.

3. The method of claim 1, the balun and the inverter amplifier residing on a single chip, the common ground node residing on-chip, and the ground voltage residing off-chip.

4. The method of claim 2, further comprising:
   coupling the common ground node to a peaking inductor, the peaking inductor coupled to the ground voltage.

5. The method of claim 4, the peaking inductor being on-chip.

6. The method of claim 5, the peaking inductor being a spiral inductor.

7. The method of claim 4, the peaking inductor being off-chip.

8. The method of claim 7, the peaking inductor being a bondwire.

9. The method of claim 4, the peaking inductor having an inductance of at least 1 nH.

10. The method of claim 2, the inverter amplifier comprising a common-source amplifier, the source node of the common-source amplifier being the source node of the amplifier, the gate node of the common-source amplifier coupled to the balun secondary element first node.

11. The method of claim 10, the inverter amplifier further comprising transistors for selectively enabling or disabling the inverter amplifier in response to a control signal.

12. An apparatus, comprising:
an inverter amplifier having an input node and a source node and comprising an NMOS transistor and a PMOS transistor configured as common-source amplifiers; and
a balun coupled to the inverter amplifier, wherein:
the balun comprises a balun secondary element for providing a single-ended signal to the inverter amplifier;
the balun secondary element comprises a first node and a second node;
the balun secondary element first node is coupled to the input node of the inverter amplifier;
the balun secondary element second node is coupled to the inverter amplifier source node via a common ground node; and
the common ground node is coupled to a ground voltage.

13. The apparatus of claim 12, the inverter amplifier being a pre-driver amplifier, the pre-driver amplifier further coupled to a driver amplifier.

14. The apparatus of claim 12, the apparatus comprising a first chip, the balun and the inverter amplifier residing on the first chip, the common ground node residing on the first chip, the ground voltage residing off the first chip.

15. The apparatus of claim 13, further comprising a peaking inductor, the peaking inductor coupled to the ground voltage.

16. The apparatus of claim 15, the peaking inductor residing on the first chip.

17. The apparatus of claim 16, the peaking inductor being a spiral inductor.

18. The apparatus of claim 15, the peaking inductor residing off-chip.

19. The apparatus of claim 18, the peaking inductor being a bondwire.

20. The apparatus of claim 19, the peaking inductor having an inductance of at least 1 nH.

21. The apparatus of claim 14, the inverter amplifier comprising a common-source amplifier, the source node of the common-source amplifier being the source node of the amplifier, the gate node of the common-source amplifier coupled to the balun secondary element first node.

22. The apparatus of claim 12, the apparatus being a transmitter circuit.

23. The apparatus of claim 12, the apparatus being a receiver circuit.

24. An apparatus, comprising:
an inverter amplifier having an input node and a source node and comprising an NMOS transistor and a PMOS transistor configured as common-source amplifiers;
a balun coupled to the inverter amplifier, wherein:
the balun comprises a balun secondary element for providing a single-ended signal to the amplifier;
the balun secondary element comprises comprising a first node and a second node; and
the balun secondary element first node is coupled to the input node of the amplifier; and
means for coupling the inverter amplifier source node to the balun secondary element second node at a common ground node using a trace of minimum length.

25. The apparatus of claim 24, further comprising:
peaking inductance means for coupling the common ground node to an off-chip ground voltage.

* * * * *